United States Patent
Minzoni

(10) Patent No.: US 7,170,813 B2
(45) Date of Patent: Jan. 30, 2007

(54) MEMORY CIRCUIT RECEIVERS ACTIVATED BY ENABLE CIRCUIT

(75) Inventor: Alessandro Minzoni, Morrisville, NC (US)

(73) Assignee: Infineon Technologies AG, Munich (DE)

( * ) Notice: Subject to any disclaimer, the term of this patent is extended or adjusted under 35 U.S.C. 154(b) by 29 days.

(21) Appl. No.: 11/013,582

(22) Filed: Dec. 16, 2004

(65) Prior Publication Data

US 2006/0133130 A1    Jun. 22, 2006

(51) Int. Cl.
*G11C 7/00* (2006.01)
(52) U.S. Cl. .................. 365/229; 365/233; 365/194
(58) Field of Classification Search ............... 365/229, 365/233, 194
See application file for complete search history.

(56) References Cited

U.S. PATENT DOCUMENTS

| | | | |
|---|---|---|---|
| 5,953,286 A * | 9/1999 | Matsubara et al. | 365/233 |
| 6,208,582 B1 * | 3/2001 | Kanda et al. | 365/233 |
| 6,265,947 B1 | 7/2001 | Klemmer et al. | |
| 6,285,625 B1 * | 9/2001 | Vogley | 365/233 |
| 6,360,085 B1 | 3/2002 | Walley | |
| 6,759,879 B2 | 7/2004 | Fischer et al. | |
| 6,816,994 B2 * | 11/2004 | Schoenfeld et al. | 365/226 |
| 2002/0055342 A1 | 5/2002 | Walley | |

* cited by examiner

*Primary Examiner*—David Lam
(74) *Attorney, Agent, or Firm*—Dicke, Billig & Czaja, PLLC

(57) ABSTRACT

A memory circuit comprises an enable circuit and a receiver. The enable circuit is configured to receive an internal clock signal and provide an enable signal having a first logic level and a second logic level. The receiver is configured to be activated in response to the first logic level of the enable signal and deactivated in response to the second logic level of the enable signal.

18 Claims, 5 Drawing Sheets

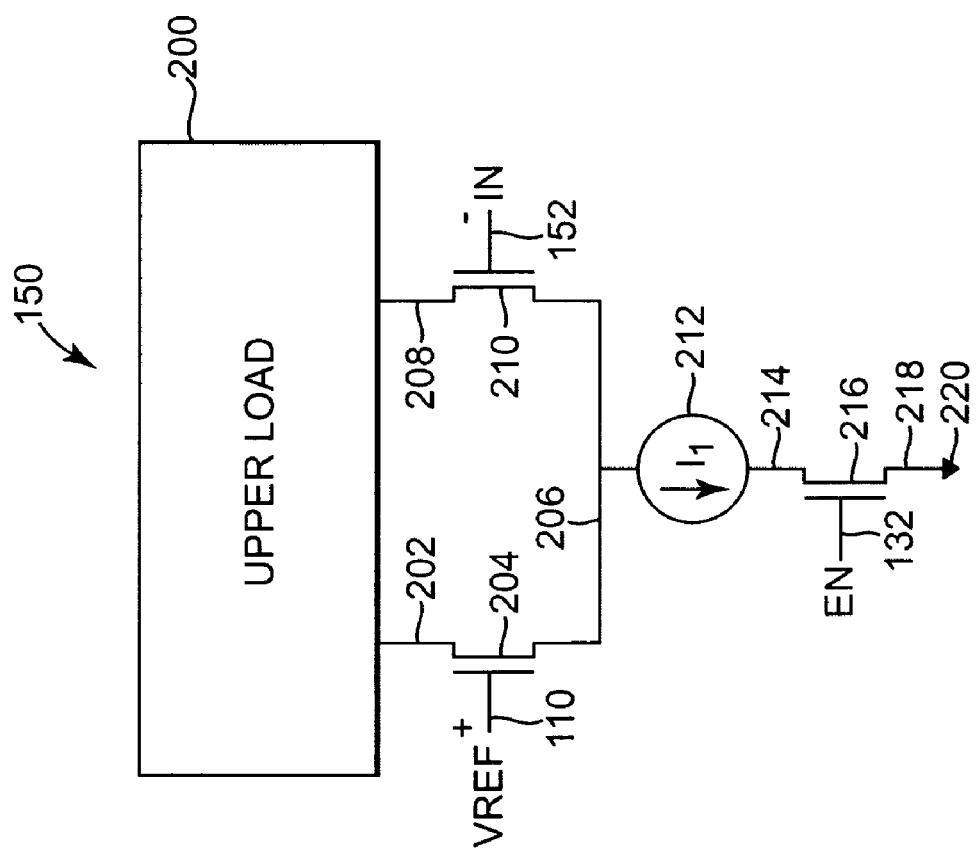

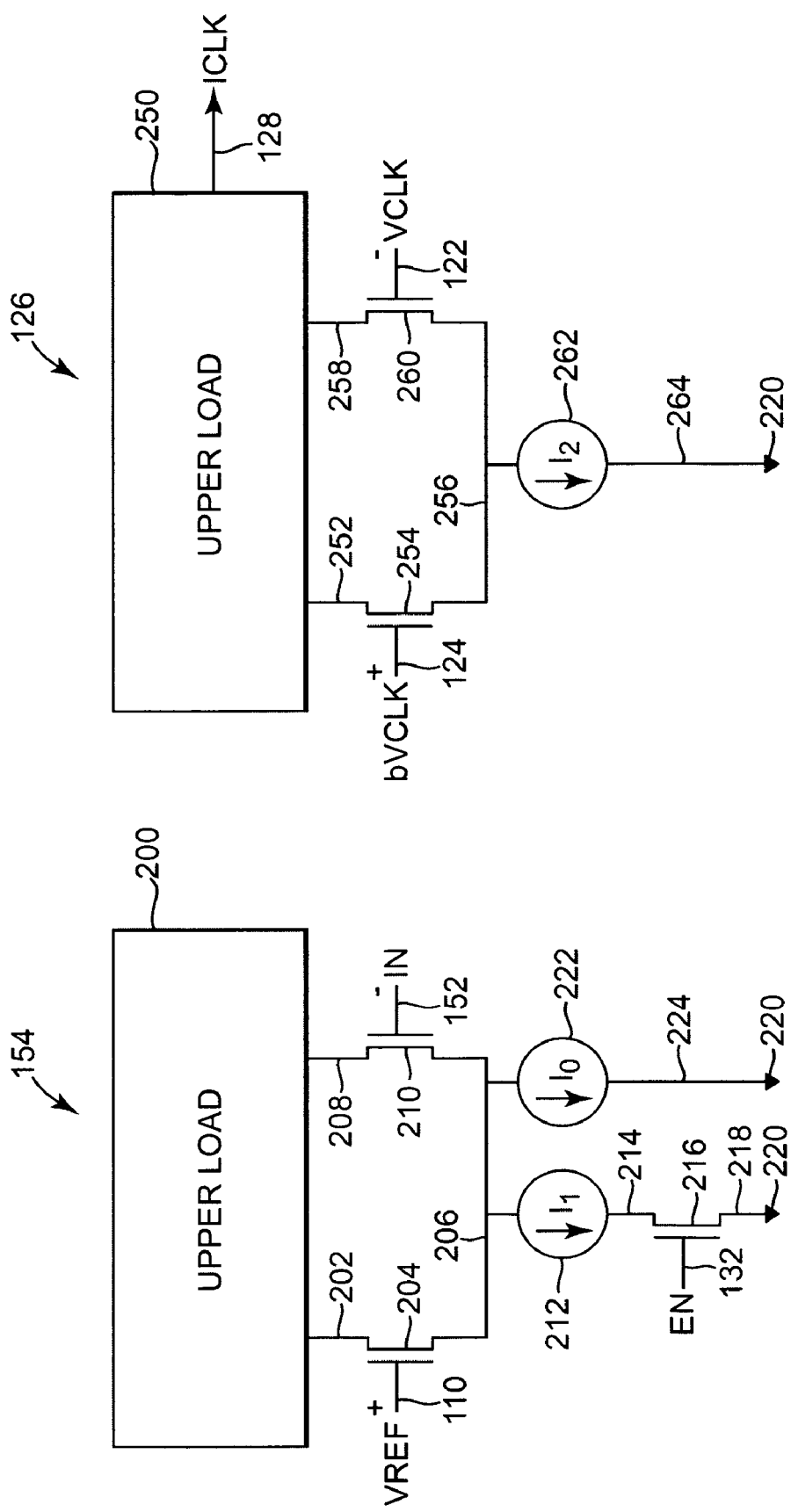

MEMORY CIRCUIT RECEIVERS ACTIVATED BY ENABLE CIRCUIT

BACKGROUND

Memories, such as dynamic random access memories (DRAMs), synchronous dynamic random access memories (SDRAMs), double data rate synchronous dynamic random access memories (DDR SDRAMs), double data rate two synchronous dynamic random access memories (DDR2 SDRAMs), pseudo-static random access memories (PSRAMs), cellular random access memories (CellularRAMs), and mobile random access memories (Mobile-RAMs) include receivers for receiving address signals, command signals, and bank select signals for reading data from and writing data to the memories. Typically, the address signals, command signals, and bank select signals are provided to the inputs of the corresponding receivers of the memory for a time longer than necessary for the receivers to collect and decode the signals. The receivers only need the input signals to be present for a minimum setup and hold time.

The setup and hold times are typically referenced with respect to a rising edge of an external differential clock signal. The setup time is the time the input signal needs to be provided to the receiver before the rising edge of the external clock signal, and the hold time is the time the input signal needs to be provided to the receiver after the rising edge of the external clock signal. If the input signal is not provided to the receiver during the setup and hold time, then the receiver may not properly collect and decode the input signal for use in accessing the memory.

Typically, receivers are activated and ready to receive an input signal at all times. Therefore, the receivers require a constant current source, which continues to consume power even when the receiver is not being used. For low power and/or battery powered applications, such as cellular phones and other portable electronic devices, memories that conserve power are desired.

SUMMARY

One embodiment of the present invention provides a memory circuit. The memory circuit comprises an enable circuit and a receiver. The enable circuit is configured to receive an internal clock signal and provide an enable signal having a first logic level and a second logic level. The receiver is configured to be activated in response to the first logic level of the enable signal and deactivated in response to the second logic level of the enable signal.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

FIG. 2 is a diagram illustrating one embodiment of a receiver.

FIG. 3 is a diagram illustrating another embodiment of a receiver.

FIG. 4 is a diagram illustrating one embodiment of a clock receiver.

DETAILED DESCRIPTION

Figure 1:
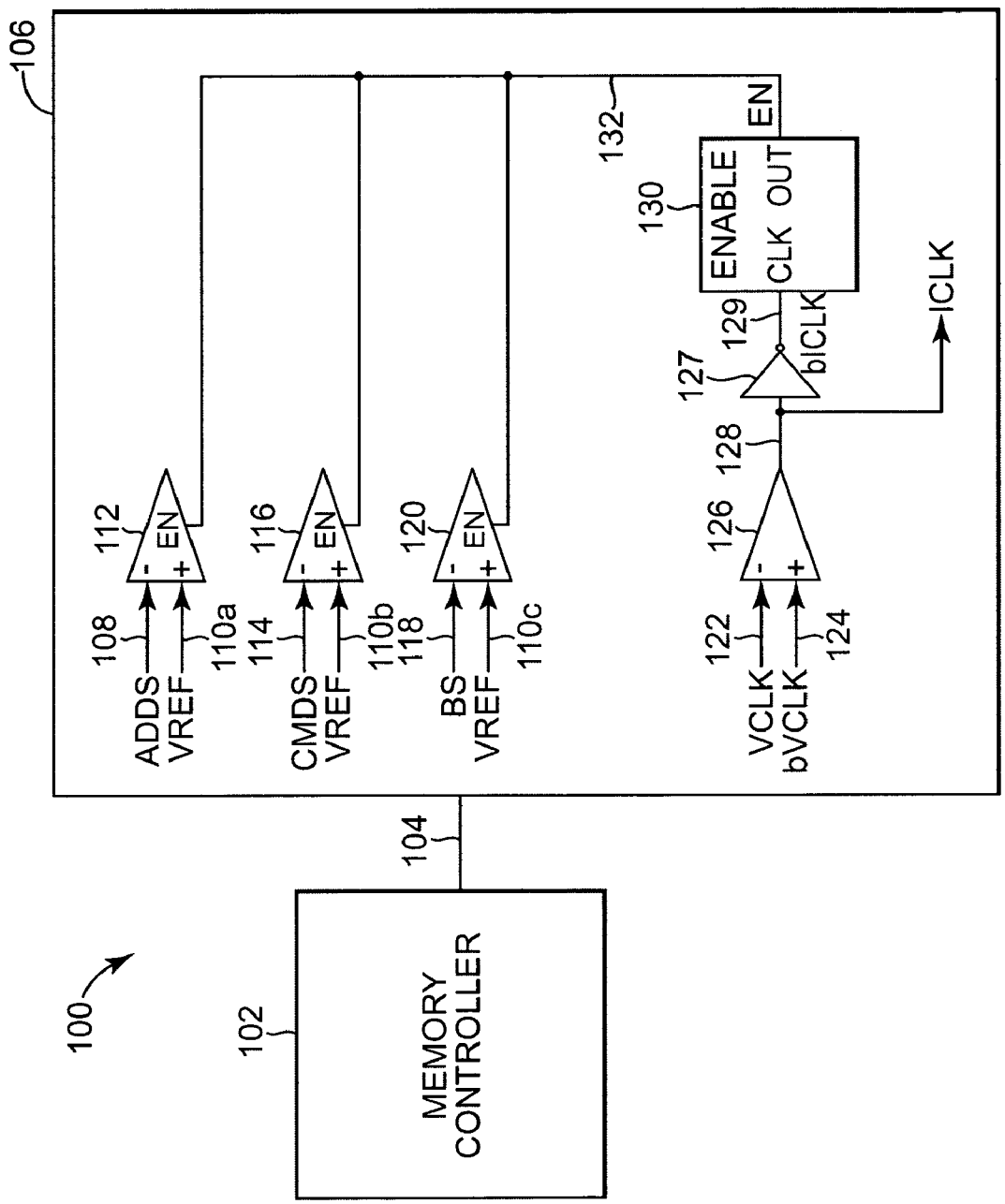
FIG. 1 is a diagram illustrating one embodiment of a memory system including receivers activated by an enable circuit.

FIG. 1 is a block diagram illustrating one embodiment of a memory system 100. Memory system 100 includes a memory controller 102 and a memory circuit 106. Memory controller 102 is electrically coupled to memory circuit 106 through communication link 104. Memory circuit 106 includes address receiver 112, command receiver 116, bank select receiver 120, clock receiver 126, enable circuit 130, and inverter 127. Address receiver 112, command receiver 116, and bank select receiver 120 are configured to be selectively activated by an enable signal provided by enable circuit 130. Address receiver 11-2, command receiver 116, and bank select receiver 120 are activated to receive an address signal, a command signal, and a bank select signal during a setup and hold time of the address receiver 112, command receiver 116, and bank select receiver 120, respectively. Outside the setup and hold time of the address receiver 112, command receiver 116, and bank select receiver 120, the address receiver 112, command receiver 116, and bank select receiver 120 are deactivated. When deactivated, the current supply to address receiver 112, command receiver 116, and bank select receiver 120 is switched off or reduced to conserve power.

The negative input of address receiver 112 receives the address (ADDS) signal on ADDS signal path 108, and the positive input of address receiver 112 receives the reference voltage (VREF) signal on VREF signal path 110a. The negative input of command receiver 116 receives the command (CMDS) signal on CMDS signal path 114, and the positive input of command receiver 116 receives the VREF signal on VREF signal path 110b. Bank select receiver 120 receives the bank select (BS) signal on BS signal path 118, and the positive input of bank select receiver 120 receives the VREF signal on VREF signal path 110c.

The negative input of clock receiver 126 receives the clock (VCLK) signal on VCLK signal path 122, and the positive input of clock receiver 126 receives the inverted clock (bVCLK) signal on bVCLK signal path 124. The output of clock receiver 126 is electrically coupled to the input of inverter 127 through internal clock (ICLK) signal path 128. The output of inverter 127 is electrically coupled to the clock (CLK) input of enable circuit 130 through inverted ICLK (bICLK) signal path 129. The output of enable circuit 130 is electrically coupled to the enable (EN) input of address receiver 112, the EN input of command receiver 116, and the EN input of bank select receiver 120 through enable (EN) signal path 132.

Memory controller 102 communicates with memory circuit 106 through communication link 104. Memory controller 102 controls reading data from and writing data to memory circuit 106. In one embodiment, memory circuit 106 is a random access memory, such as a dynamic random access memory (DRAM), synchronous dynamic random access memory (SDRAM), double data rate synchronous dynamic random access memory (DDR SDRAM), double data rate two synchronous dynamic random access memory (DDR2 SDRAM), pseudo-static random access memory (PSRAM), cellular random access memory (CellularRAM), or mobile random access memory (Mobile-RAM). In one embodiment, memory controller 102 provides the ADDS signal on ADDS signal path 108, the CMDS signal on CMDS signal path 114, the BS signal on BS signal path 118, the VCLK signal on VCLK signal path 122, and the bVCLK signal on bVCLK signal path 124 to memory circuit 106 through communication link 104.

In response to a logic high EN signal on EN signal path 132, address receiver 112 is activated and compares the ADDS signal on ADDS signal path 108 to the VREF signal on VREF signal path 110a. In one embodiment, in response to a logic low EN signal, address receiver 112 is deactivated by switching off the current supply for address receiver 112 to place address receiver 112 in a powered down mode. In another embodiment, in response to a logic low EN signal, address receiver 112 is deactivated by reducing the current supply for address receiver 112 to place address receiver 112 in a standby mode.

In response to a logic high EN signal on EN signal path 132, command receiver 116 is activated and compares the CMDS signal on CMDS signal path 114 to the VREF signal on VREF signal path 110b. In one embodiment, in response to a logic low EN signal, command receiver 116 is deactivated by switching off the current supply for command receiver 116 to place command receiver 116 in a powered down mode. In another embodiment, in response to a logic low EN signal, command receiver 116 is deactivated by reducing the current supply for command receiver 116 to place command receiver 116 in a standby mode.

In response to a logic high EN signal on EN signal path 132, bank select receiver 120 is activated and compares the BS Signal on BS signal path 118 to the VREF signal on VREF signal path 110c. In one embodiment, in response to a logic low EN signal, bank select receiver 120 is deactivated by switching off the current supply for bank select receiver 120 to place bank select receiver 120 in a powered down mode. In another embodiment, in response to a logic low EN signal, bank select receiver 120 is deactivated by reducing the current supply for bank select receiver 120 to place bank select receiver 120 in a standby mode.

Clock receiver 126 receives the differential clock signal, VCLK and bVCLK, on VCLK signal path 122 and bVCLK signal path 124 to provide the ICLK signal on ICLK signal path 128. Inverter 127 inverts the ICLK signal on ICLK signal path 128 to provide the bICLK signal on bICLK signal path 129. Enable circuit 130 receives the bICLK signal on bICLK signal path 129 and provides the EN signal on EN signal path 132. Enable circuit 130 delays the rising edge of the bICLK signal by a first delay to provide the rising edge of the EN signal before the setup time for address receiver 112, command receiver 116, and bank select receiver 120. Enable circuit 130 delays the falling edge of the bICLK signal by a second delay to provide the falling edge of the EN signal after the hold time for address receiver 112, command receiver 116, and bank select receiver 120. The first delay and the second delay are selected to provide an EN signal having a logic high phase time equal to or greater than the minimum setup and hold times for address receiver 112, command receiver 116, and bank select receiver 120.

FIG. 2 is a diagram illustrating one embodiment of a receiver 150. In one embodiment, receiver 150 is similar to address receiver 112, command receiver 116, and bank select receiver 120. Receiver 150 includes an upper load 200, transistors 204, 210, and 216, and current source 212. Upper load 200 is electrically coupled to one side of the source-drain path of transistor 204 through signal path 202 and one side of the source-drain path of transistor 210 through signal path 208. The other side of the source-drain path of transistor 204 is electrically coupled to one side of current source 212 and the other side of the source-drain path of transistor 210 through signal path 206.

The gate of transistor 204 is electrically coupled to VREF signal path 110. VREF signal path 110 is similar to VREF signal path 110a for address receiver 112, VREF signal path 110b for command receiver 116, and VREF signal path 110c for bank select receiver 120. The gate of transistor 210 is electrically coupled to input (IN) signal path 152. IN signal path 152 is similar to ADDS signal path 112 for address receiver 112, CMDS signal path 114 for command receiver 116, and BS signal path 118 for bank select receiver 120. The other side of current source 212 is electrically coupled to one side of the source-drain path of transistor 216 through signal path 214. The other side of the source-drain path of transistor 216 is electrically coupled to common or ground 220 through signal path 218. The gate of transistor 216 is electrically coupled to EN signal path 132.

Upper load 200 comprises the logic circuit for receiver 150 for collecting and decoding the IN signal on IN signal path 152 in reference to the VREF signal on VREF signal path 110. Transistors 204 and 210 provide a differential structure for receiving the VREF signal on VREF signal path 110 and the IN signal on IN signal path 152. Current source 212 provides the current for operating receiver 150. In one embodiment, current source 212 comprises a current mirror that provides a current $I_1$.

Transistor 216 acts as a switch to activate and deactivate receiver 150. In response to a logic high EN signal on EN signal path 132, transistor 132 turns on (conducting) to enable current source 212. With current source 212 enabled, receiver 150 is activated and can receive and decode the IN signal on IN signal path 152. In response to a logic low EN signal on EN signal path 132, transistor 216 turns off (non-conducting) to disable current source 212. With current source 212 disabled, receiver 150 is deactivated and in a powered down mode and cannot receive and decode the IN signal on IN signal path 152.

FIG. 3 is a diagram illustrating another embodiment of a receiver 154. In one embodiment, receiver 154 is similar to address receiver 112, command receiver 116, and bank select receiver 120. Receiver 154 includes similar elements as previously described receiver 150, except receiver 154 includes an additional current source 222. One side of current source 222 is electrically coupled to one side of current source 212, one side of the source-drain path of transistor 204, and one side of the source-drain path of transistor 210 through signal path 206. The other side of current source 222 is electrically coupled to common or ground 220 through signal path 224.

Receiver 154 operates similar to previously described receiver 150, except that current source 222 of receiver 154 remains enabled with a logic low EN signal on EN signal path 132. In one embodiment, current source 222 comprises a current mirror that provides a current $I_0$. The current $I_0$ is less than the current $I_1$ of current source 212, such that current source 222 keeps receiver 154 in a standby or low power mode with current source 212 switched off. Current $I_0$ of current source 222 is not large enough to activate receiver 154, but allows receiver 154 to be activated and stabilized more quickly when current source 212 is enabled than if current source 222 were not used.

FIG. 4 is a diagram illustrating one embodiment of clock receiver 126. Clock receiver 126 includes upper load 250, transistors 254 and 260, and current source 262. Upper load 250 is electrically coupled to one side of the source-drain path of transistor 254 through signal path 252, one side of the source-drain path of transistor 260 through signal path 258, and ICLK signal path 128. The other side of the source-drain path of transistor 254 is electrically coupled to the other side of the source-drain path of transistor 260 and one side of current source 262 through signal path 256. The gate of transistor 254 is electrically coupled to bVCLK signal path 124. The gate of transistor 260 is electrically coupled to VCLK signal path 122. The other side other side of current source 262 is electrically coupled to common or ground 220 through signal path 264.

Upper load 250 comprises the logic circuit for clock receiver 126 for collecting and decoding the bVCLK signal on bVCLK signal path 124 and the VCLK signal on VCLK signal path 122. Transistors 254 and 260 provide a differential structure for receiving the bVCLK signal and the VCLK signal. Current source 262 provides the current for operating clock receiver 126. In one embodiment, current source 262 comprises a current mirror that provides a current $I_2$.

Clock receiver 126 receives the differential clock signal, VCLK and bVCLK, to provide the ICLK signal on ICLK signal path 128. In response to the bVCLK signal transitioning to a logic high and the VCLK signal transitioning to a logic low, the ICLK signal transitions to a logic low. In response to the bVCLK signal transitioning to a logic low and the VCLK signal transitioning to a logic high, the ICLK signal transitions to a logic high.

Figure 5:
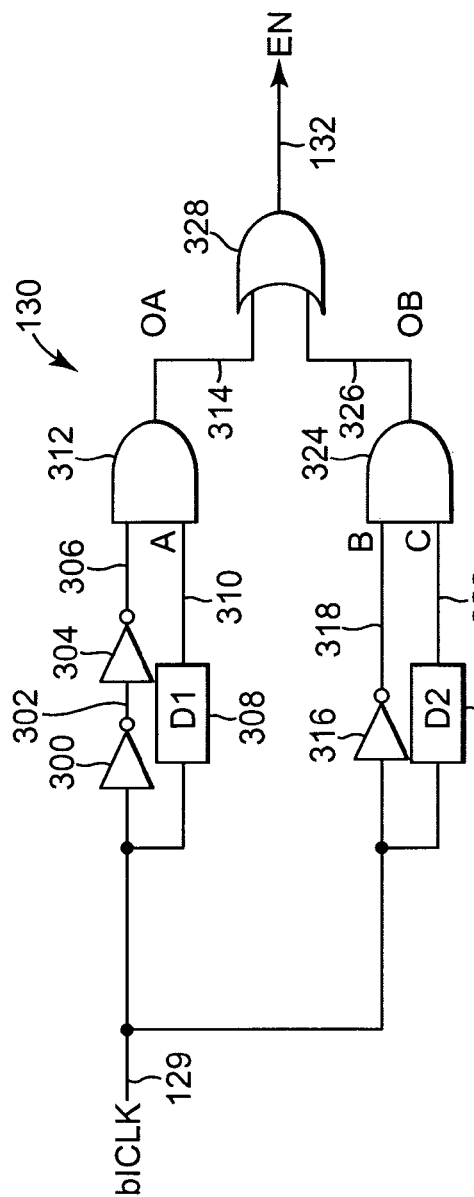
FIG. 5 is a schematic diagram illustrating one embodiment of an enable circuit.

FIG. 5 is a schematic diagram illustrating one embodiment of enable circuit 130. Enable circuit 130 includes inverters 300, 304, and 316, delay one (D1) 308, delay two (D2) 320, AND gates 312 and 324, and OR gate 328. The bICLK signal path 129 is electrically coupled to the input of inverter 300, the input of delay one 308, the input of the inverter 316, and the input of delay two 320. The output of inverter 300 is electrically coupled to the input of inverter 304 through signal path 302. The output of inverter 304 is electrically coupled to a first input of AND gate 312 through signal path 306. The output of delay one 308 is electrically coupled to a second input of AND gate 312 through A signal path 310. The output of AND gate 312 is electrically coupled to a first input of OR gate 328 through OA signal path 314.

The output of inverter 316 is electrically coupled to a first input of AND gate. 324 through B signal path 318. The output of delay two 320 is electrically coupled to a second input of AND gate 324 through C signal path 322. The output of AND gate 324 is electrically coupled to a second input of OR gate 328 through OB signal path 326. The output of OR gate 328 is electrically coupled to EN signal path 132.

Inverter 300 inverts the bICLK signal on bICLK signal path 129 to provide an inverted bICLK signal on signal path 302. Inverter 304 inverts the inverted bICLK signal on signal path 302 to provide a two inverter delayed bICLK signal on signal path 306. Delay one 308 delays the bICLK signal on bICLK signal path 129 to provide the A signal on A signal path 310.

AND gate 312 receives the signal on signal path 306 and the A signal on A signal path 310 and provides the OA signal on OA signal path 314. In response to a logic high signal on signal path 306 and a logic high A signal, AND gate 312 outputs a logic high OA signal. In response to a logic low signal on signal path 306 or a logic low A signal, AND gate 312 outputs a logic low OA signal.

Inverter 316 inverts the bICLK signal on bICLK signal path 129 to provide the B signal on B signal path 318. Delay two 320 delays the bICLK signal on bICLK signal path 129 to provide the C signal on C signal path 322. AND gate 324 receives the B signal on B signal path 318 and the C signal on C signal path 322, and provides the OB signal on OB signal path 326. In response to a logic high B signal and a logic high C signal, AND gate 324 outputs a logic high OB signal. In response to a logic low B signal or a logic low C signal, AND gate 324 outputs a logic low OB signal.

OR gate 328 receives the OA signal on OA signal path 314 and the OB signal on OB signal path 326, and provides the EN signal on EN signal path 132. In response to a logic high OA signal or a logic high OB signal, OR gate 328 outputs a logic high EN signal. In response to a logic low OA signal and a logic low OB signal, OR gate 328 outputs a logic low EN signal.

In operation, the rising edge of the bICLK signal is delayed by delay one 308 to provide the rising edge of the EN signal through AND gate 312 and OR gate 328. Delay one 308 is selected such that the rising edge of the EN signal activates address receiver 112, command receiver 116, and bank select receiver 120 to provide an adequate setup time for address receiver 112, command receiver 116, and bank select receiver 120. The falling edge of the bICLK signal is delayed by delay two 320 to provide the falling edge of the enable signal through AND gate 324 and OR gate 328. Delay two 320 is selected such that the falling edge of the EN signal deactivates address receiver 112, command receiver 116, and bank select receiver 120 after the logic high EN signal provides an adequate hold time for address receiver 112, command receiver 116, and bank select receiver 120.

Figure 6:
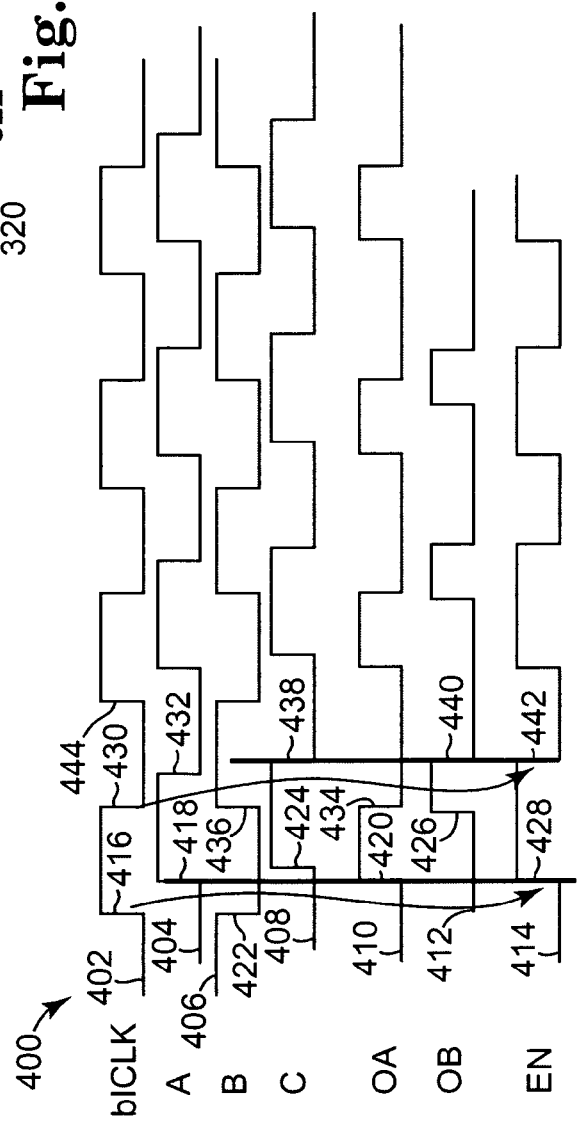
FIG. 6 is a timing diagram illustrating one embodiment of the timing of signals for the enable circuit.

FIG. 6 is a timing diagram 400 illustrating one embodiment of the timing of signals for delay circuit 130. Timing diagram 400 includes bICLK signal 402 on bICLK signal path 129, A signal 404 on A signal path 310, B signal 406 on B signal path 318, C signal 408 on C signal path 322, OA signal 410 on OA signal path 314, OB signal 412 on OB signal path 326, and EN signal 414 on EN signal path 132.

Rising edge 416 of bICLK signal 402 is delayed by delay one 308 to provide rising edge 418 of A signal 404 and by delay two 320 to provide rising edge 424 of C signal 408. Rising edge 416 of bICLK signal 402 is also inverted by inverter 316 to provide falling edge 422 of B signal 406. With bICLK signal 402 logic high (after passing through inverters 300 and 304) and in response to rising edge 418 of A signal 404, AND gate 312 provides rising edge 420 of OA signal 410. In response to rising edge 420 of OA signal 410, OR gate 328 provides rising edge 428 of EN signal 414.

The bICLK signal 402 transitions to a logic low at 430. With A signal 404 logic high and in response to falling edge 430 of bICLK signal 402 (after passing through inverters 300 and 304), AND gate 312 provides falling edge 434 of OA signal 410. Falling edge 430 of bICLK signal 402 is inverted by inverter 316 to provide rising edge 436 of B signal 406. With C signal 408 logic high and in response to rising edge 436 of B signal 406, AND gate 324 provides rising edge 426 of OB signal 412. With OB signal 412 logic high, OR gate 328 continues to provide a logic high EN signal 414.

Falling edge 430 of bICLK signal 402 is delayed by delay one 308 to provide falling edge 432 of A signal 404 and by delay two 320 to provide falling edge 438 of C signal 408. With B signal 406 logic high and in response to falling edge 438 of C signal 408, AND gate 324 provides falling edge 440 of OB signal 412. In response to falling edge 440 of OB signal 412, OR gate 328 provides falling edge 442 of EN signal 414. The process is repeated beginning at rising edge 444 of bICLK signal 402.

Figure 7:
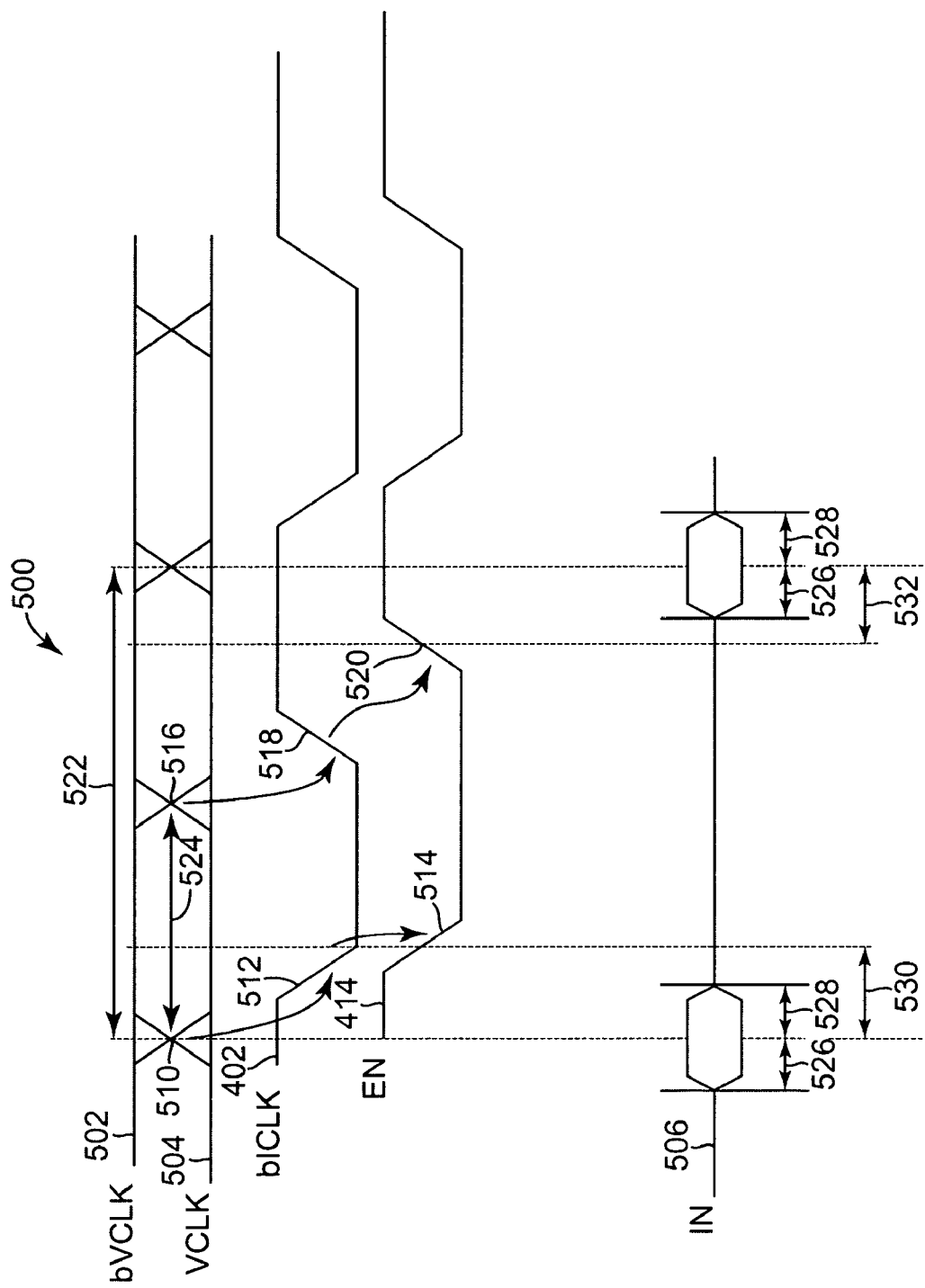
FIG. 7 is a timing diagram illustrating one embodiment of the timing of signals for a memory circuit.

FIG. 7 is a timing diagram illustrating one embodiment of the timing of signals for memory circuit 106. Timing diagram 500 includes bVCLK signal 502 on bVCLK signal path 124, VCLK signal 504 on VCLK signal path 122, bICLK signal 402 on bICLK signal path 129, EN signal 414 on EN signal path 132, and IN signal 506. IN signal 506 is representative of the ADDS signal on ADDS signal path 108, the CMDS signal CMDS signal path 114, and the BS signal on BS signal path 118.

In response to VCLK signal 504 transitioning to logic high and bVCLK signal 502 transitioning to logic low at 510, clock receiver 126 and inverter 127 provide falling edge 512 of bICLK signal 402 after a VCLK signal 504 rising edge to bICLK signal 402 falling edge propagation delay (drf). In response to falling edge 512 of bICLK signal 402, enable circuit 130 provides falling edge 514 of EN signal 414 after a falling edge propagation delay (d1). In response to VCLK signal 504 transitioning to logic low and bVCLK signal 502 transitioning to logic high at 516, clock receiver 126 and inverter 127 provide rising edge 518 of bICLK signal 402 after a VCLK signal 504 falling edge to bICLK signal 402 rising edge propagation delay (dfr). In response rising edge 518 of bICLK signal 402, enable circuit 130 provides rising edge 520 of EN signal 414 after a rising edge propagation delay (d2). EN signal 414 is logic high during a receiver setup time (Tsrcv), indicated at 532, and during a receiver hold time (Thrcv), indicated at 530. The setup time (Ts), indicated at 526, and the hold time (Th), indicated at 528, of IN signal 506 falls within the logic high phase of EN signal 414.

The cycle time (Tcyc) for differential clock signal VCLK 504 and bVCLK 502 is indicated at 522. The logic high phase (Thigh) of differential clock signal VCLK 504 and bVCLK 502 is indicated at 524. The duty cycle (Dcyc) for differential clock signal VCLK 504 and bVCLK 502 equals the logic high phase time divided by the cycle time (Dcyc=Thigh/Tcyc). The setup time (Tsrcv) 532 for the receivers is greater than the minimum setup time (Ts) 526 for IN signal 506, and the hold time (Thrcv) 530 for the receivers is greater than the minimum hold time (Th) 528 for IN signal 506. In one embodiment, delay one 308 (FIG. 5) is selected such that Tsrcv=Tcyc*(1−Dcyc)−dfr−d2>Ts, and delay two 320 (FIG. 5) is selected such that Thrcv=drf+d1>Th.

Memory circuit 106 including address receiver 112, command receiver 116, and bank select receiver 120, which are selectively enabled by enable circuit 130, provides a power conserving option for use in memory systems. By activating the receivers to collect and decode the input signals to the receivers and deactivating the receivers between the input signals, power is conserved for low power applications, such as in cellular phones and other portable electronic devices.

What is claimed is:

1. A memory circuit comprising:
an enable circuit configured to receive an internal clock signal and provide an enable signal having a first logic level and a second logic level; and
a receiver configured to be activated in response to the first logic level of the enable signal and deactivated in response to the second logic level of the enable signal, wherein the receiver comprises:
a first current source; and
a switch coupled to the first current source, the switch configured to enable the first current source in response to the first logic level of the enable signal and disable the first current source in response to the second logic level of the enable signal.

2. The memory circuit of claim 1, wherein the receiver further comprises:
a second current source configured to maintain the receiver in a standby mode in response to the second logic level of the enable signal.

3. The memory circuit of claim 2, wherein the first current source provides a first current and the second current source provides a second current, and wherein the first current is greater than the second current.

4. The memory circuit of claim 1, further comprising:
a clock receiver configured to receive a differential external clock signal and provide the internal clock signal.

5. The memory circuit of claim 1, wherein the receiver comprises an address receiver.

6. The memory circuit of claim 1, wherein the receiver comprises a command receiver.

7. The memory circuit of claim 1, wherein the receiver comprises a bank select receiver.

8. A memory circuit comprising:
an enable circuit configured to receive an internal clock signal and provide an enable signal having a first logic level and a second logic level; and
a receiver configured to bc activated in response to the first logic level of the enable signal and deactivated in response to the second logic level of the enable signal, wherein the enable circuit comprises:
a first delay configured to delay a rising edge of the internal clock signal to provide a rising edge of the enable signal; and
a second delay configured to delay a falling edge of the internal clock signal to provide a falling edge of the enable signal.

9. A memory circuit comprising:
an address receiver configured to be selectively activated in response to an enable signal;
a command receiver configured to be selectively activated in response to the enable signal;
a bank select receiver configured to be selectively activated in response to the enable signal;
a clock receiver configured to receive a differential external clock signal and provide an internal clock signal;
an enable circuit configured to receive the internal clock signal and provide the enable signal to activate the address receiver, the conimand receiver, and the bank select receiver during a setup and hold time of the address receiver, the command receiver, and the bank select receiver; and
a memory coupled the address receiver, the command receiver, and the bank select receiver.

10. The memory circuit of claim 9, wherein the memory comprises a dynamic random access memory.

11. The memory circuit of claim 9, wherein the memory comprises a mobile random access memory.

12. The memory circuit of claim 9, wherein the memory comprises a pseudo-static random access memory.

13. The memory circuit of claim 12, wherein the memory comprises a cellular random access memory.

14. A method for receiving a signal in a memory circuit, the method comprising:
receiving an internal clock signal and providing an enable signal having a first logic level and a second logic level; and
activating a receiver in response to the first logic level of the enable signal and deactivating the receiver in response to the second logic level of the enable signal, wherein activating the receiver comprises switching on a current source of the receiver in response to the first logic level of the enable signal, and wherein deactivating the receiver comprises switching off the current source in response to the second logic level of the enable signal.

15. A method for receiving a signal in a memory circuit, the method comprising:
   receiving an internal clock signal and providing an enable signal having a first logic level and a second logic level;
   activating a receiver in response to the first logic level of the enable signal and deactivating the receiver in response to the second logic level of the enable signal; and
   receiving a differential external clock signal and providing the internal clock signal in response to the differential external clock signal.

16. A method for receiving a signal in a memory circuit, the method comprising:
   receiving an internal clock signal and providing an enable signal having a first logic level and a second logic level; and
   activating a receiver in response to the first logic level of the enable signal and deactivating the receiver in response to ihe second logic level of the enable signal,
   wherein providing the enable signal comprises delaying a rising edge of the internal clock signal by a first delay to provide a rising edge of the enable signal and delaying a falling edge of the internal clock signal by a second delay to provide a falling edge of the enable signal.

17. A method for receiving a signal in a memory circuit, the method comoprising:
   receiving an internal clock signal and providing an enable signal having a first logic level and a second logic level; and
   activating a receiver in response to the first logic level of the enable signal and deactivating the receiver in response to the second logic level of the enable signal,
   wherein providing the enable signal having the first logic level comprises providing the enable signal having the first logic level during a time equal to a setup and hold time of the receiver.

18. A memory circuit for low power applications comprising:
   an address receiver configured to be selectively activated to collect and decode address signals and deactivated to conserve power between the address signals in response to an enable signal;
   a command receiver configured to be selectively activated to collect and decode command signals and deactivated to conserve power between command signals in response to the enable signal;
   a bank select receiver configured to be selectively activated to collect and decode bank select signals and deactivated to conserve power between bank select signals in response to the enable signal;
   a clock receiver configured to receive a differential external clock signal and provide an internal clock signal;
   an enable circuit configured to receive the internal clock signal and provide the enable signal to activate the address receiver, the command receiver, and the bank select receiver during a setup and hold time of the address receiver, the command receiver, and the bank select receiver; and
   a memory coupled the address receiver, the command receiver, and the bank select receiver.

* * * * *